United States Patent
Bakker

(10) Patent No.: US 7,659,585 B2
(45) Date of Patent: *Feb. 9, 2010

(54) ESD PROTECTION STRUCTURE FOR I/O PAD SUBJECT TO BOTH POSITIVE AND NEGATIVE VOLTAGES

(75) Inventor: Gregory Bakker, San Jose, CA (US)

(73) Assignee: Actel Corporation, Mountain View, CA (US)

(*) Notice: Subject to any disclaimer, the term of this patent is extended or adjusted under 35 U.S.C. 154(b) by 12 days.

This patent is subject to a terminal disclaimer.

(21) Appl. No.: 12/179,243

(22) Filed: Jul. 24, 2008

(65) Prior Publication Data

US 2008/0296688 A1 Dec. 4, 2008

Related U.S. Application Data

(62) Division of application No. 11/027,788, filed on Dec. 29, 2004, now Pat. No. 7,446,378.

(51) Int. Cl.
   *H01L 23/62* (2006.01)
(52) U.S. Cl. ........................... 257/355; 257/360
(58) Field of Classification Search ............... 257/355, 257/360
   See application file for complete search history.

(56) References Cited

U.S. PATENT DOCUMENTS

| | | | |
|---|---|---|---|
| 4,503,494 A | 3/1985 | Hamilton et al. | |
| 4,758,745 A | 7/1988 | Elgamal et al. | |
| 4,870,302 A | 9/1989 | Freeman | |
| 5,101,122 A | 3/1992 | Shinonara | |

(Continued)

FOREIGN PATENT DOCUMENTS

EP    1 831 980 A    9/2007

(Continued)

OTHER PUBLICATIONS

Notification of Transmittal of the International Search Report and The Written Opinion of the International Searching Authority, or the Declaration and International Search Report of Corresponding PCT Application PCT/US05/45522, dated Jul. 27, 2006, Form PCT/ISA/220 and Form PCT/ISA/210 (first and second sheets).

(Continued)

*Primary Examiner*—Douglas M Menz
(74) *Attorney, Agent, or Firm*—Lewis and Roca LLP

(57) ABSTRACT

An ESD protection circuit is disclosed for an n-channel MOS transistor formed in an inner p-well of a triple-well process and connected to an I/O pad that may experience both positive and negative voltages according to the present invention. A first switch connects the p-well containing the n-channel MOS transistor to ground if the voltage at the I/O pad is positive and a second switch connects the p-well containing the n-channel MOS transistor to the I/O pad if the voltage at the I/O pad is negative. A third switch connects the gate of the n-channel MOS transistor to the p-well if it is turned off and a fourth switch connects the gate of the n-channel MOS transistor to $V_{cc}$ if it is turned on.

8 Claims, 3 Drawing Sheets

U.S. PATENT DOCUMENTS

| | | | |
|---|---|---|---|
| 5,132,571 | A | 7/1992 | McCollum et al. |
| 5,559,449 | A | 9/1996 | Padoan et al. |
| 5,563,526 | A | 10/1996 | Hastings et al. |
| 5,687,325 | A | 11/1997 | Chang |
| 5,811,987 | A | 9/1998 | Ashmore, Jr. et al. |
| 5,821,776 | A | 10/1998 | McGowan |
| 6,150,837 | A | 11/2000 | Beal et al. |
| 6,260,087 | B1 | 7/2001 | Chang |
| 6,266,222 | B1 | 7/2001 | Columbo et al. |
| 6,272,646 | B1 | 8/2001 | Rangasayee et al. |
| 6,329,694 | B1 | 12/2001 | Lee et al. |
| 6,600,355 | B1 | 7/2003 | Nguyen |
| 6,614,320 | B1 | 9/2003 | Sullam et al. |
| 7,446,378 | B2 * | 11/2008 | Bakker ................... 257/355 |
| 2002/0007467 | A1 | 1/2002 | Ma et al. |
| 2002/0108006 | A1 | 8/2002 | Snyder |
| 2004/0164354 | A1 | 8/2004 | Mergens et al. |
| 2006/0138544 | A1 | 6/2006 | Bakker |

FOREIGN PATENT DOCUMENTS

| | | |
|---|---|---|
| JP | 2008-526043 A | 7/2008 |

OTHER PUBLICATIONS

Author: Anonymous, 4-Pin μP Voltage Monitors with Manual Reset Input, Maxim Integrated Products, document 19-0411; Rev 3; Mar. 1999, pp. 1-8.

Author: Anonymous, "Fan Controller and Remote Temperature Sensor with SMBus Serial Interface" for MAX1669, Maxim Integrated Products, document 19-1575; Rev 0; Jan. 2000, pp. 1-20.

Author: Anonymous, "Precision RESET Controller and 4K I²C Memory With Both RESET ad RESET Outputs" for S24042/S24043, Summit Microelectronics, Inc., document 2011 2.0 5/2/00, pp. 1-14, May 2000.

Author: Anonymous, "SOT23, Low-Power μP Supervisory Circuits with Battery Backup and Chip-Enable Gating" for MAX6365-MAX6368, Maxim Integrated Products, document 19-1658; Rev 1; Jun. 2001, pp. 1-15.

Author: Anonymous, "Cypress MicroSystems PsoC Microcontrollers Now Available in Volume", Cypress Semiconductor Corporation Press Release Sep. 5, 2001 [Internet: mhtml:file://D:\Act401\Cypress%20Semiconductor%20Corporation.mht].

Author: Anonymous, "nvSRAM—SRAM and EEPROM within a single chip" ZMD AG, pp. 1-4, Oct. 2001.

Author: Anonymous, "Intelligent Temperature Monitor and Dual PWM Fan Controller" for ADM1031, Analog Devices, pp. 1-32, 2003 (no month).

Author: Anonymous, "LM63 ±1° C/±3° C Accurate Remote Diode Digital Temperature Sensor with Integrated Fan Control", National Semiconductor Corporation, document DS200570, pp. 1-28, May 2003.

Author: Anonymous, "PsoC™ Configurable Mixed-Signal Array with On-board Controller", CY8C25122, CY8C26233, CY8C26443, CY8C26643, Device Data Sheet for Silicon Revision D, Cypress MicroSystems Document #: 38-12010 CY Rev. *B CMS Rev. 3.22, pp. 1-150, Aug. 18, 2003.

Author: Anonymous, "PSoC™ Mixed Signal Array", Preliminary Data Sheet for CY8C29466, CY8C29566, CY8C29666, and CY8C29866, Cypress MicroSystems Document No. 38-12013 Rev. *D., pp. 1-41, Jun. 2004.

Kwang-Hoon Oh et al., "Modeling of Temperature Dependent Contact Resistance for Analysis of ESD Reliability", IEEE 03CH37400, 41st Annual International Reliability Physics Symposium, Dallas, Texas, pp. 249-255, Aug. 2003.

V. Vassilev et al., "Dynamic Substrate Resistance Snapback Triggering of ESD Protection Devices", IEEE 03CH37400, 41st Annual International Reliability Physics Symposium, Dallas, Texas, pp. 256-260, Aug. 2003.

* cited by examiner

ESD PROTECTION STRUCTURE FOR I/O PAD SUBJECT TO BOTH POSITIVE AND NEGATIVE VOLTAGES

CROSS-REFERENCE TO RELATED APPLICATIONS

This application is a divisional of co-pending U.S. patent application Ser. No. 11/027,788, filed Dec. 29, 2004, which is hereby incorporated by reference as if set forth herein.

BACKGROUND OF THE INVENTION

1. Field of the Invention

The present invention relates to integrated circuits. More particularly, the present invention relates to integrated circuits having analog input/output (I/O) pads connected to circuits for protecting the integrated circuit against electrostatic discharge (ESD) events.

2. The Prior Art

ESD events are likely to occur during human handling of integrated circuits. These events can generate thousands of volts that may potentially destroy portions of the integrated circuit adjacent to and connected to the I/O pads of the integrated circuit. It is known to provide ESD protection at the I/O pads of integrated circuits to protect circuit elements from ESD events.

Programmable integrated circuits are known in the art. An emerging trend has been to include both analog and digital circuits on the same integrated circuit die. The inputs and outputs of analog circuits on the integrated circuit are coupled to I/O pads. In some cases, it is desired to provide an integrated circuit that can drive a signal to I/O pads for controlling external analog circuit elements. The flexibility of such drive circuits is enhanced if they can provide current sourcing and sinking capability at both positive and negative potentials at the integrated circuit I/O pad. This capability presents a challenge to the ESD protection circuit designer, since an ESD protection circuit that will function for a circuit biased at a positive potential will not necessarily function if that same circuit is biased at a negative potential.

BRIEF DESCRIPTION OF THE INVENTION

An ESD protection circuit is disclosed for an n-channel MOS transistor formed in an inner p-well of a triple-well process and connected to an I/O pad that may experience both positive and negative voltages according to the present invention. A first switch connects the p-well containing the n-channel MOS transistor to ground if the voltage at the I/O pad is positive and a second switch connects the p-well containing the n-channel MOS transistor to the I/O pad if the voltage at the I/O pad is negative. A third switch connects the gate of the n-channel MOS transistor to the p-well if it is turned off and a fourth switch connects the gate of the n-channel MOS transistor to $V_{cc}$ if it is turned on.

An ESD protection circuit for an n-channel MOS transistor is formed in an inner p-well of a triple-well structure and is connected to an I/O pad that may experience both positive and negative voltages. A first semiconductor switch connects the p-well containing the n-channel MOS transistor to ground if the voltage at the I/O pad is positive. A second semiconductor switch connects the p-well containing the n-channel MOS transistor to the I/O pad if the voltage at the I/O pad is negative. The source and drain of the n-channel MOS transistor are each formed according to at least one ESD design rule.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
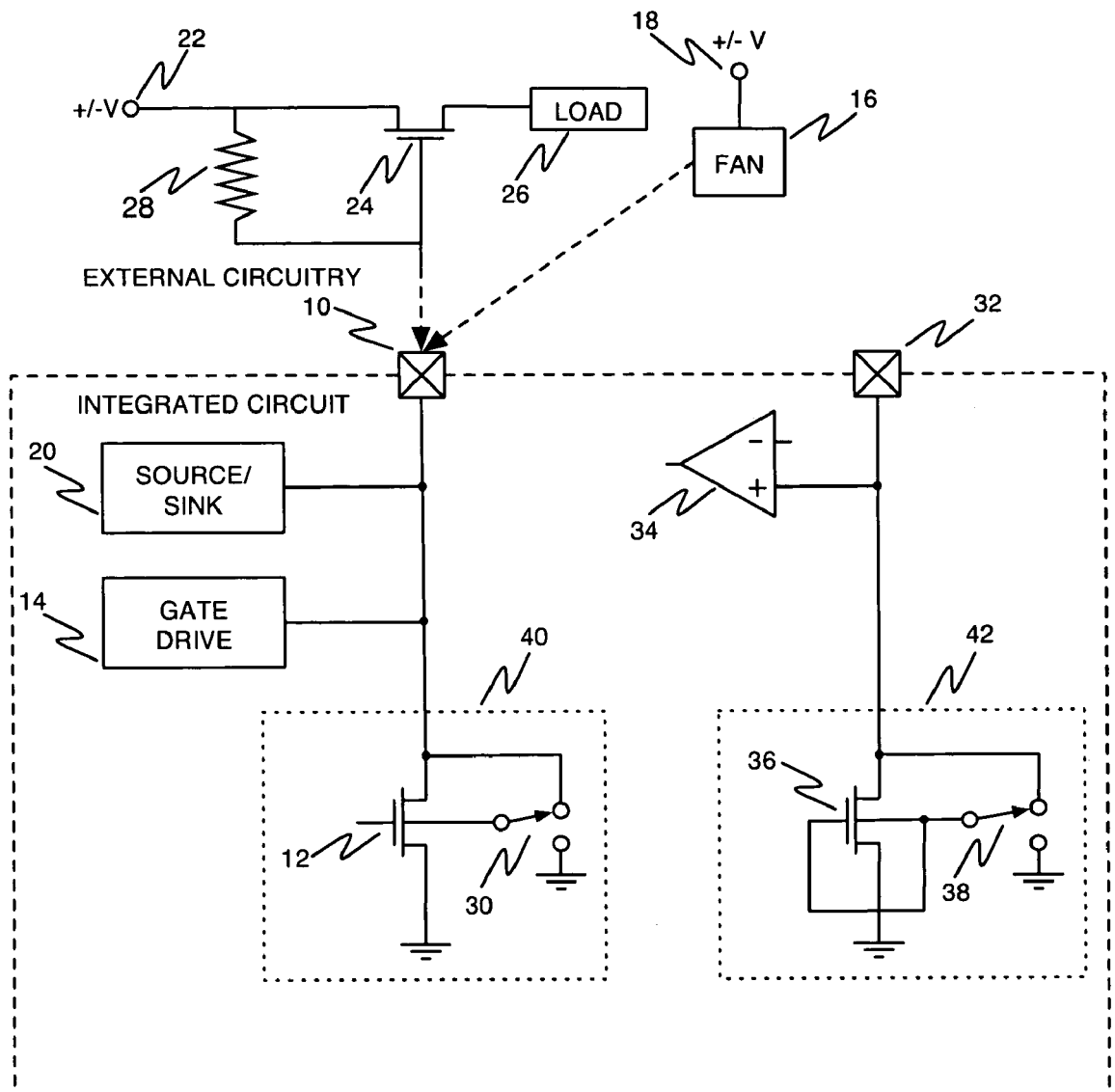
FIG. 1 is a simplified schematic diagram showing an illustrative environment in which the present invention may be used.

Referring first to FIG. 1, an exemplary embodiment of an ESD protection circuit is shown in the environment of an I/O pad 10 that may used to provide a switched ground connection for selectively powering an external device such as a fan or to provide a gate drive for an external transistor. I/O pad 10 is coupled to the drain of an n-channel MOS transistor 12 inside the integrated circuit. The source of n-channel MOS transistor 12 is coupled to ground along with the substrate of the integrated circuit, and its gate is coupled to a gate drive circuit 14. MOS transistor 12 is a large device (e.g., with a width to length ratio on the order of 400/1, much larger than the other transistors in the circuit) and may be used to provide a path to ground for driving a device such as an external fan 16. One power terminal of the fan 16 would be connected to I/O pad 10 (as shown by a dashed line) and the other power terminal of the fan 16 would be connected to a power supply potential 18. By turning on MOS transistor 12, a ground path is provided for the fan circuit to energize the fan 16.

A signal line is coupled between I/O pad 10 and circuitry 20 that may either source or sink current to establish a voltage to drive the gate of an external MOS transistor. As shown in FIG. 1, a typical environment in which such a gate driver circuit would be used includes an external power supply 22 coupled between an external MOS transistor 24 and a load 26. An external resistor 28 is coupled between the external power supply 22 and the I/O pad 10, to which the gate of the external MOS transistor 24 is also coupled as shown by a dashed line. Depending on whether the external power supply is positive or negative (and, consequently, whether the external MOS transistor 24 is an n-channel device or a p-channel device) the internal gate driver circuit in the integrated circuit will be configured to either source current from a positive supply or sink current from a negative supply via I/O pad 10 to establish a gate-drive voltage across external resistor 28.

N-channel MOS transistor 12 may be employed as an ESD protection device according to the present invention. As shown in FIG. 1, switch 30 is used to connect the bulk of the n-channel MOS transistor 12 to either ground or the I/O pad 10, depending on whether the voltage potential at the I/O pad is positive or negative as will be disclosed herein.

In addition, FIG. 1 shows a second example of the present invention in which I/O pad 32 is used as an input I/O pad and coupled to an input of an internal analog operational amplifier 34. N-channel MOS transistor 36 has its drain coupled to the I/O pad, its source coupled to ground, and its gate and bulk coupled to a switch 38. Switch 38 is used to connect the bulk of the n-channel MOS transistor 36 to either ground or the I/O pad 32, depending on whether the voltage potential at the I/O pad 32 is positive or negative as will be disclosed herein. N-channel MOS transistor 36 serves as an ESD protection device.

In applications such as FPGA integrated circuits, it is often desirable or necessary to locate the n-channel MOS transistors 12 and 36 of FIG. 1 in a p-well within an n-well on a p-type substrate in a triple-well process. The present invention provides ESD protection for a circuits of the type described above. If the voltage at the I/O pad 10 (or 32) is negative, the p-well is connected to the I/O pad. If the voltage at I/O pad 10 (or 32) is positive, the p-well is connected to ground. Persons of ordinary skill in the art will appreciate that only one device such as transistors 12 and 36 may be disposed in a single p-well so that a positive voltage on one I/O pad does not cause the p-well to be connected to the I/O pad while a negative voltage on the other I/O pad causes the same p-well to be coupled to ground. Thus, FIG. 1 shows n-channel MOS transistor 12 disposed in a first p-well represented by dashed boundary 40 and n-channel MOS transistor 36 disposed in a second p-well represented by dashed boundary 42.

Figure 2:
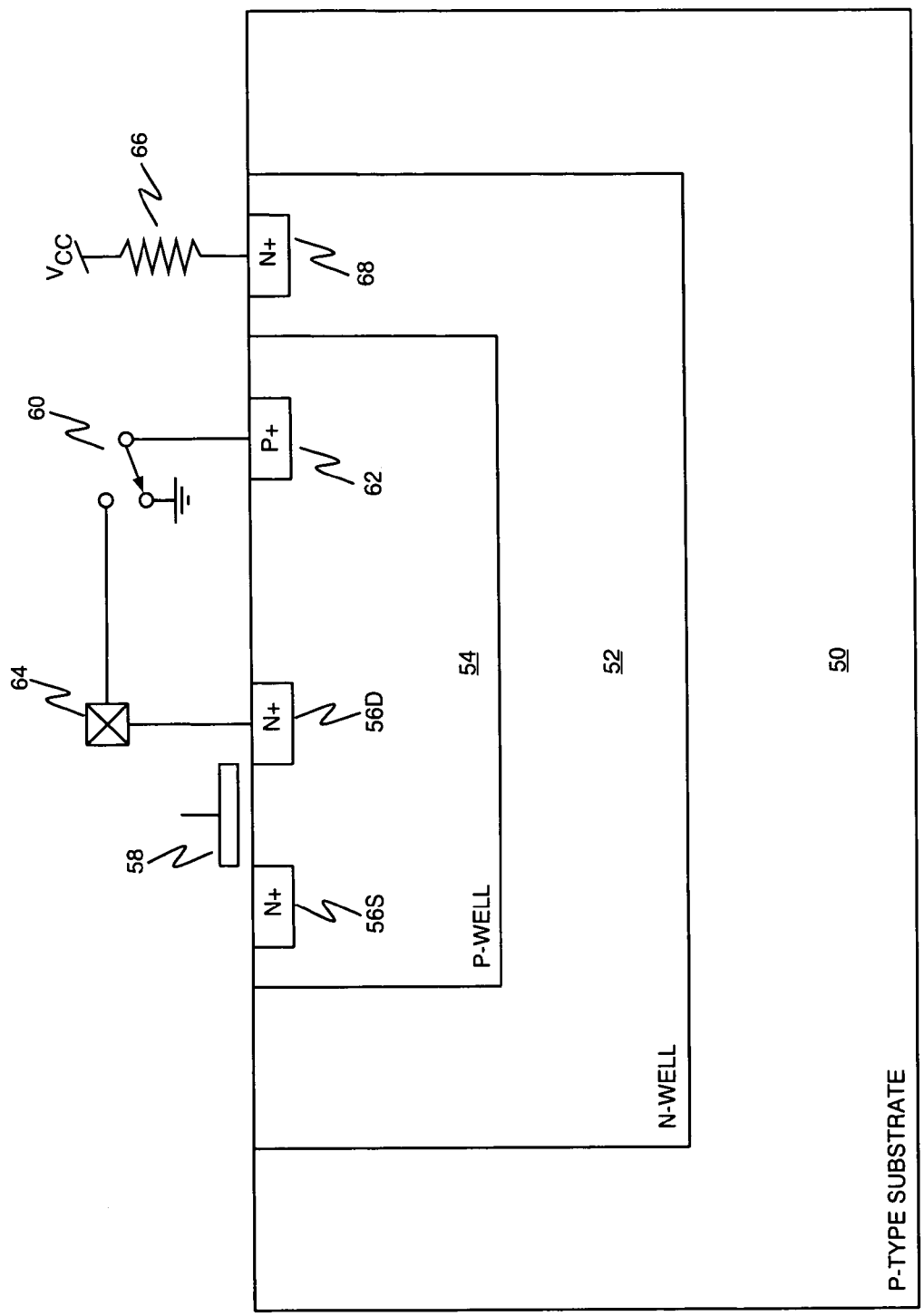
FIG. 2 is a cross sectional view of a portion of a semiconductor substrate, showing the triple-well structure in which the circuits of the present invention are formed.

Referring now to FIG. 2, a cross sectional view of a portion of a semiconductor substrate, shows the triple-well structure in which the circuits of the present invention are formed. Semiconductor substrate 50 supports an n-well 52. A p-well 54 is formed within n-well 52. N-channel MOS transistor 12 of FIG. 1 is formed within p-well 54, and has doped region 56S as its source and doped region 56D as its drain. Polysilicon region 58 forms its gate as is well known in the art of MOS transistor fabrication.

Switch 60 is coupled to p-well 54 via P+ region 62. Switch 60 is used to couple p-well 54 to either ground or I/O pad (reference numeral 64) depending on the voltage present at I/O pad 64 in accordance with the present invention. Resistor 66 couples n-well 52 2(via contact 68) to $V_{cc}$ in accordance with the present invention. The resistance of resistor 66 may be about 200 ohms, although other values may be employed.

A conventional ESD protection device would be fabricated directly in the P-type substrate 50 and P-well 54, but without the N-well 52. The device source 56S is connected to ground and substrate as in the present invention, as is the p-well, since the p-well is not isolated from the substrate by the n-well 52. In the conventional device the I/O pad connected to the drain can only be used for voltages above ground potential, since applying a voltage below ground will forward bias the drain to ground diode (formed by the N+drain 56D, and the p-well/substrate). During a positive ESD event with a conventional device (where the voltage at the I/O pad is positive with respect to ground), the large discharge current is controlled to flow from the pad to ground, largely by the function of the lateral NPN bipolar transistor formed by the drain 56D (acting as the bipolar collector), the p-well 54 (acting as the bipolar base), and the source 56S (acting as the bipolar emitter). Once triggered the bipolar base is self biased by the large minority carrier current generated in the high field region near the collector. This mechanism is well known in the art.

For a conventional device, during a negative ESD event the large ESD current flows through the forward biased diode between drain and p-well/substrate.

In the present invention, the main current path during a positive ESD event is the same as the conventional device just described (i.e. from drain to source through lateral bipolar action). During a negative ESD event, however, the current cannot flow through a forward biased drain to p-well diode because the p-well is not connected to ground. In this case ESD current is carried by the lateral bipolar transistor in the opposite direction between source 56S (now the collector) and the drain 56D (now the emitter). Thus positive and negative ESD events are handled symmetrically by the n-channel MOS transistor 12 according to the present invention.

Special design rules (referred to herein as ESD design rules) are often applied to an ESD device, such as: drain (and sometimes source) contact to gate offsets, salicide blocking, special ESD implant, contact to N+edge spacing, etc., in order to achieve more uniform dissipation of the discharge energy, to avoid destruction of the MOS transistor 12. These special rules are well known in the art. See, for example, Modeling of Temperature Dependant Contact Resistance for Analysis of ESD Reliability, Kwang-Hoon Oh, Jung-Hoon Chun, Kaustav Banerjee, Charvaka Duvvury, Robert W. Dutton; IEEE International Reliability Physics Symposium Proceedings 2003; Dynamic Substrate Resistance Snapback Triggering of ESD Protection Devices, V. Vassilev, G Groeseneken, M Steyaert, H Maes IEEE International Reliability Physics Symposium Proceedings 2003. Both of these articles are incorporated herein by reference in their entirety. According to the present invention, these rules are applied symmetrically to both the source 36S and drain 36D since they both may act as collector or emitter depending on the ESD event polarity.

Figure 3:
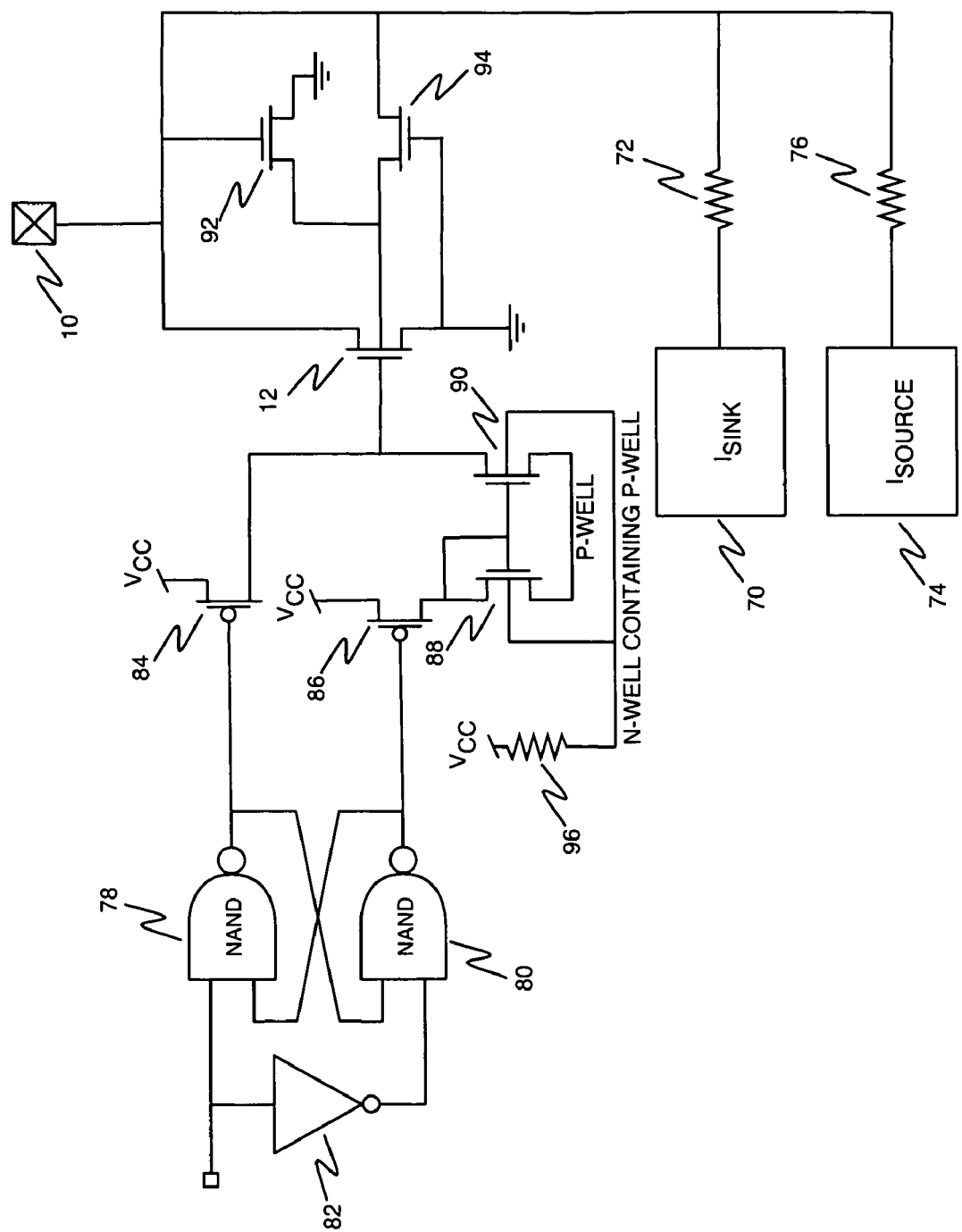
FIG. 3 is a schematic diagram showing an illustrative embodiment of circuits to implement the present invention.

Referring now to FIG. 3, illustrative circuitry for implementing the present invention is shown. Current-sink circuitry 70 is coupled to I/O pad 10 through a resistor 72. When activated, current-sink circuitry 70 provides a negative potential at I/O pad 10 at varying levels of current sinking. Current-source circuitry 74 is coupled to I/O pad 10 through a resistor 76. When activated, current-source circuitry 74 provides a positive potential at I/O pad 10 at varying levels of current sourcing. A resistance of about 10K ohms has been found to be satisfactory for resistors 72 and 76 although persons of ordinary skill in the art will understand that other values could be employed.

NAND gates 78 and 80 are cross coupled to form a latch. The input of NAND gate 78 is driven by an enable signal and the input of NAND gate 80 is driven by the complement of the enable signal through inverter 82. When the enable signal is off (low), the output of NAND gate 78 is at a high logic level and the output of NAND gate 80 is at a low logic level.

The output of NAND gate 78 drives the gate of p-channel MOS transistor 84. The source of p-channel MOS transistor 84 is coupled to $V_{cc}$ and the drain of p-channel MOS transistor 84 is coupled to the gate of n-channel MOS transistor 12 from FIG. 1. When the enable signal is off (low) and the output of NAND gate 88 is at a high logic level, p-channel MOS transistor 84 is turned off. When the enable signal is on (high) and the output of NAND gate 88 is at a low logic level, p-channel MOS transistor 84 is turned on, thus turning on n-channel MOS transistor 12 to allow it to sink current from a load such as fan 16 from FIG. 1.

The output of NAND gate 80 drives the gate of p-channel MOS transistor 86. The source of p-channel MOS transistor 86 is coupled to $V_{cc}$ and the drain of p-channel MOS transistor 86 is coupled to the gate and drain of n-channel MOS transistor 88, whose source is coupled to the p-well containing n-channel MOS transistor 12. N-channel MOS transistor 88 has its gate coupled to the gate of n-channel MOS transistor 90. N-channel MOS transistor 90 has its drain coupled to the gate of n-channel MOS transistor 12, and its source coupled to the p-well containing n-channel MOS transistor 12. Persons of ordinary skill in the art will observe that a current mirror is formed from n-channel MOS transistor 88 and n-channel MOS transistor 90.

When the enable signal is off (low) and the output of NAND gate 80 is at a low logic level, p-channel MOS transistor 86 and the current mirror are both turned on. When the enable signal is on (high) and the output of NAND gate 80 is at a high logic level, p-channel MOS transistor 86 and the current mirror are both turned off. Thus, either n-channel MOS transistor 12 is turned on and the current mirror is turned off, or n-channel MOS transistor 12 is turned off and the current mirror is turned on. As will be appreciated by persons of ordinary skill in the art, when the enable signal is off, the gate of n-channel MOS transistor 12 is connected to the p-well through n-channel MOS transistor 90, and when the enable signal is on, the gate of n-channel MOS transistor 12 is connected to $V_{cc}$ through p-channel MOS transistor 84.

N-channel MOS transistor 92 has its gate coupled to I/O pad 10, its source coupled to ground, and its drain coupled to the p-well containing n-channel MOS transistor 12. N-channel MOS transistor 94 has its gate coupled to ground, its source coupled to I/O pad 10, and its drain coupled to the p-well containing n-channel MOS transistor 12. The n-well that contains the p-well in which n-channel MOS transistor 12 is formed is connected to $V_{cc}$ through a resistor 96 that may have a resistance of, for example, 200 ohms. The n-well is also connected to the bulks of n-channel MOS transistors 12, 88, 90, 92, and 94.

If the voltage at I/O pad 10 is positive, the p-well containing n-channel MOS transistor 12 is connected to ground through n-channel MOS transistor 92. If the voltage at I/O pad 10 is negative, the p-well containing n-channel MOS transistor 12 is connected to I/O pad 10 through n-channel MOS transistor 94.

An alternative to the current mirror of FIG. 3 replaces NAND gates 78 and 80, inverter 82, and MOS transistors 86, 88, 90 with a resistor from the gate of the main n-channel transistor 12 to the p-well. The enable signal may then be directly coupled to the gate of p-channel MOS transistor 84. If p-channel MOS transistor 84 is off, the resistor pulls the gate of n-channel MOS transistor 12 to the p-well potential, the most negative potential in the system, which keeps it turned off. If p-channel MOS transistor 84 is on, it sources current through the resistor, thus biasing the gate of n-channel MOS transistor 12 positive and turning it on. Typical values for the resistor are 10 k ohms to 100 k ohms. The advantage of this circuit is that no DC current is drawn while n-channel MOS transistor 12 is off (except for leakage current), but does require the resistor bias current when on. Conversely the circuit of FIG. 3 draws DC current through MOS transistors 86 and 88 when n-channel MOS transistor 12 is off, and no DC current while the device is on.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An ESD protection circuit for an n-channel MOS transistor formed in an inner p-well of a triple-well structure and connected to an I/O pad that may experience both positive and negative voltages comprising:

a first semiconductor switch connecting the p-well containing the n-channel MOS transistor to ground if the voltage at the I/O pad is positive;

a second semiconductor switch connecting the p-well containing the n-channel MOS transistor to the I/O pad if the voltage at the I/O pad is negative;

a resistor coupled between the gate of the n-channel MOS transistor and the p-well containing the n-channel MOS transistor; and a third semiconductor switch connecting the gate of the n-channel MOS transistor to $V_{cc}$ to turn the n-channel MOS transistor on.

2. The ESD protection circuit of claim 1 wherein:

the first semiconductor switch is an n-channel MOS transistor having a gate coupled to the I/O pad, a source coupled to ground, and a drain coupled to the p-well containing the MOS transistor to be protected;

the second semiconductor switch is an n-channel MOS transistor having a gate coupled to ground, a source coupled to the I/O pad, and a drain coupled to the p-well containing the MOS transistor to be protected; and the third semiconductor switch is a first p-channel MOS transistor having a gate coupled to an enable signal, a source coupled to $V_{cc}$, and a drain coupled to the gate of the MOS transistor to be protected.

3. The ESD protection circuit of claim 1 further including a current-sink circuit coupled to the I/O pad.

4. The ESD protection circuit of claim 1 further including a current-source circuit coupled to the I/O pad.

5. The ESD protection circuit of claim 1 further including:
a current-sink circuit coupled to the I/O pad; and
a current source circuit coupled to the I/O pad.

6. The ESD protection circuit of claim 1 wherein both source and drain of the MOS transistor to be protected are both formed according to at least one ESD design rule.

7. A method for protecting structures coupled to an I/O pad of an integrated circuit including a triple-well structure having an inner p-well containing an n-channel MOS transistor having a drain coupled to the I/O pad, including:

sensing the polarity of an external potential applied to the I/O pad;

coupling the inner p-well to ground if the external potential applied to the I/O pad is positive;

coupling the inner p-well to the I/O pad if the external potential applied to the I/O pad is negative; and coupling an n-well containing the inner p-well to $V_{cc}$ through a resistor.

8. An ESD protection circuit for an n-channel MOS transistor formed in an inner p-well of a triple-well structure and connected to an I/O pad that may experience both positive and negative voltages comprising:

a first semiconductor switch connecting the p-well containing the n-channel MOS transistor to ground if the voltage at the I/O pad is positive; and a second semiconductor switch connecting the p-well containing the n-channel MOS transistor to the I/O pad if the voltage at the I/O pad is negative.

* * * * *